(12) United States Patent
Gongwer et al.

(10) Patent No.: US 7,073,103 B2
(45) Date of Patent: Jul. 4, 2006

(54) SMART VERIFY FOR MULTI-STATE MEMORIES

(75) Inventors: Geoffrey S. Gongwer, Los Altos, CA (US); Daniel C. Guterman, Fremont, CA (US); Yupin Kawing Fong, Fremont, CA (US)

(73) Assignee: SanDisk Corporation, Sunnyvale, CA (US)

( * ) Notice: Subject to any disclaimer, the term of this patent is extended or adjusted under 35 U.S.C. 154(b) by 505 days.

(21) Appl. No.: 10/314,055

(22) Filed: Dec. 5, 2002

(65) Prior Publication Data

US 2004/0109362 A1    Jun. 10, 2004

(51) Int. Cl.
*G11C 29/00* (2006.01)

(52) U.S. Cl. ........................................ 714/718
(58) Field of Classification Search ................ 714/718, 714/748, 48, 721; 365/185.03, 200, 201
See application file for complete search history.

(56) References Cited

U.S. PATENT DOCUMENTS

| | | | |
|---|---|---|---|
| 5,920,507 A | | 7/1999 | Takeuchi et al. |
| 6,243,290 B1 | | 6/2001 | Kurata et al. |
| 6,324,121 B1 | * | 11/2001 | Banks ........................ 365/233 |
| 6,404,675 B1 | * | 6/2002 | Banks ........................ 365/185.03 |
| 6,522,580 B1 | | 2/2003 | Chen et al. |
| 6,538,922 B1 | * | 3/2003 | Khalid et al. .......... 365/185.03 |
| 6,745,286 B1 | * | 6/2004 | Staub et al. ................. 711/114 |
| 6,785,164 B1 | * | 8/2004 | Gonzalez et al. ...... 365/185.21 |
| 2001/0040824 A1 | * | 11/2001 | Banks ................... 365/185.22 |

FOREIGN PATENT DOCUMENTS

EP          0 856 850 A2      8/1998

OTHER PUBLICATIONS

International Search Report mailed Apr. 23, 2004.
Notification of Transmittal of the International Search Report or the Declaration, International Application No. PCT/US03/38076 for SanDisk Corporation mailed Apr. 23, 2004.

* cited by examiner

*Primary Examiner*—Phung My Chung
(74) *Attorney, Agent, or Firm*—Parsons Hsue & de Runtz LLP

(57) ABSTRACT

The present invention presents a "smart verify" technique whereby multi-state memories are programmed using a verify-results-based dynamic adjustment of the multi-states verify range for sequential-state-based verify implementations. This technique can increase multi-state write speed while maintaining reliable operation within sequentially verified, multi-state memory implementations. It does so by providing "intelligent" element to minimize the number of sequential verify operations for each program/verify/lockout step of the write sequence. In an exemplary embodiment of the write sequence for the multi-state memory during a program/verify cycle sequence of the selected storage elements, at the beginning of the process only the lowest state of the multi-state range to which the selected storage elements are being programmed is checked during the verify phase. Once the first storage state is reached by one or more of the selected elements, the next state in the sequence of multi-states is added to the verify process.

21 Claims, 12 Drawing Sheets

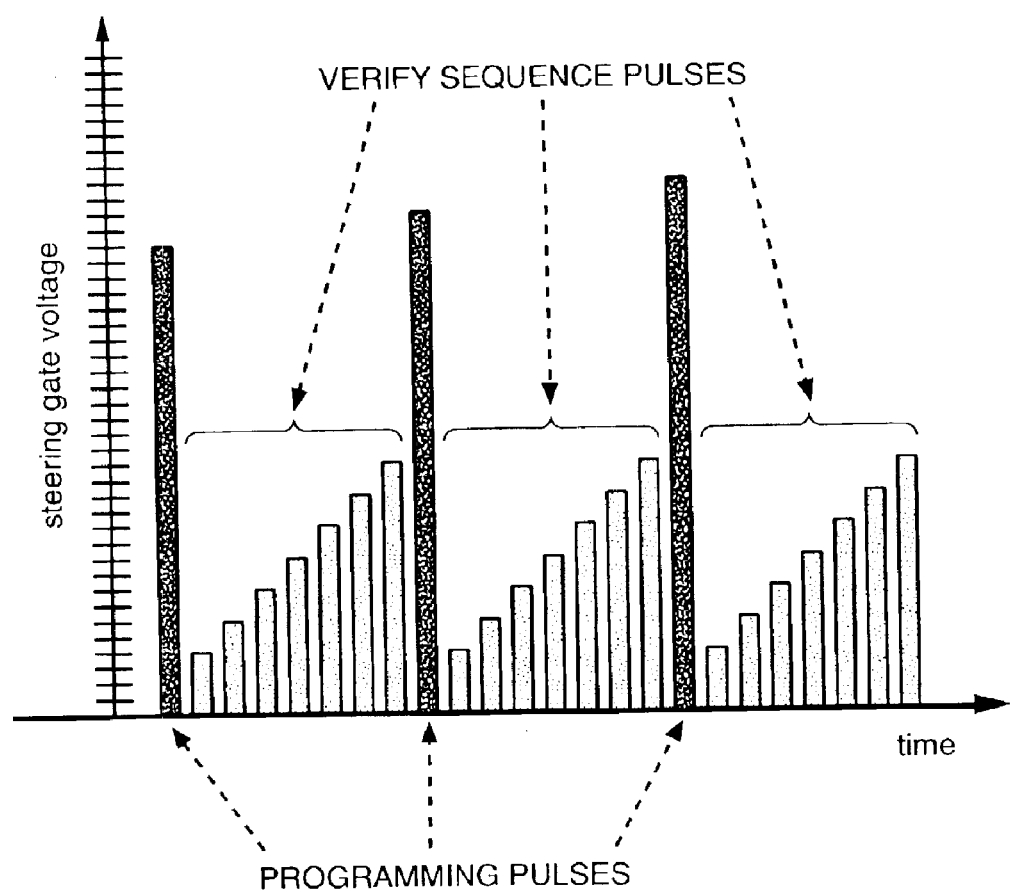
FIG._1

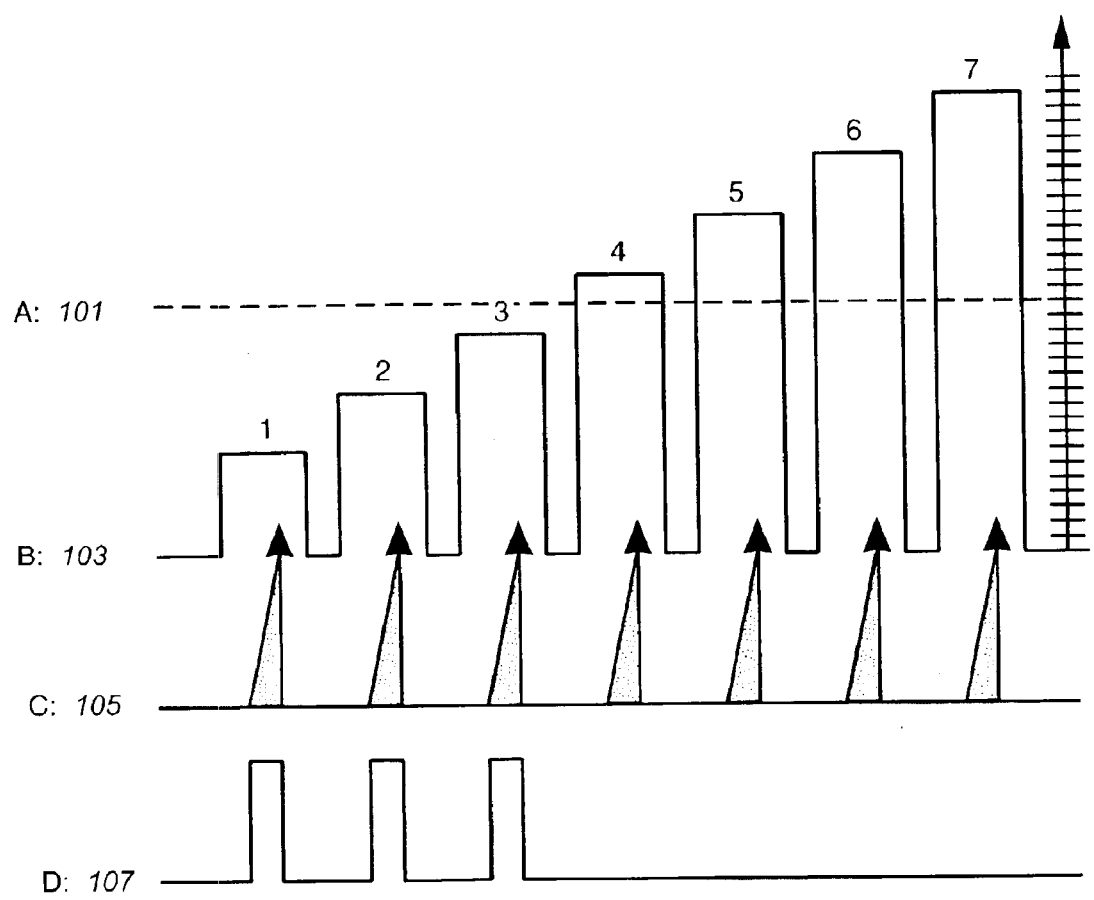
FIG._2

STATES VERIFIED

| | 1 | 2 | 3 | 4 | ... |
|---|---|---|---|---|---|
| 1 | ✓ | | | | |
| 2 | ✓ | | | | |
| 3 | ✓ | ✓ | | | |
| 4 | ✓ | ✓ | | | |
| 5 | ✓ | ✓ | ✓ | | |
| 6 | ✓ | ✓ | ✓ | | |
| 7 | ✓ | ✓ | ✓ | ✓ | |
| 8 | | ✓ | ✓ | ✓ | |
| 9 | | ✓ | ✓ | ✓ | |
| 10 | | ✓ | ✓ | ✓ | ✓ |
| 11 | | | ✓ | ✓ | ✓ |

PULSE NUMBER

*FIG._3*

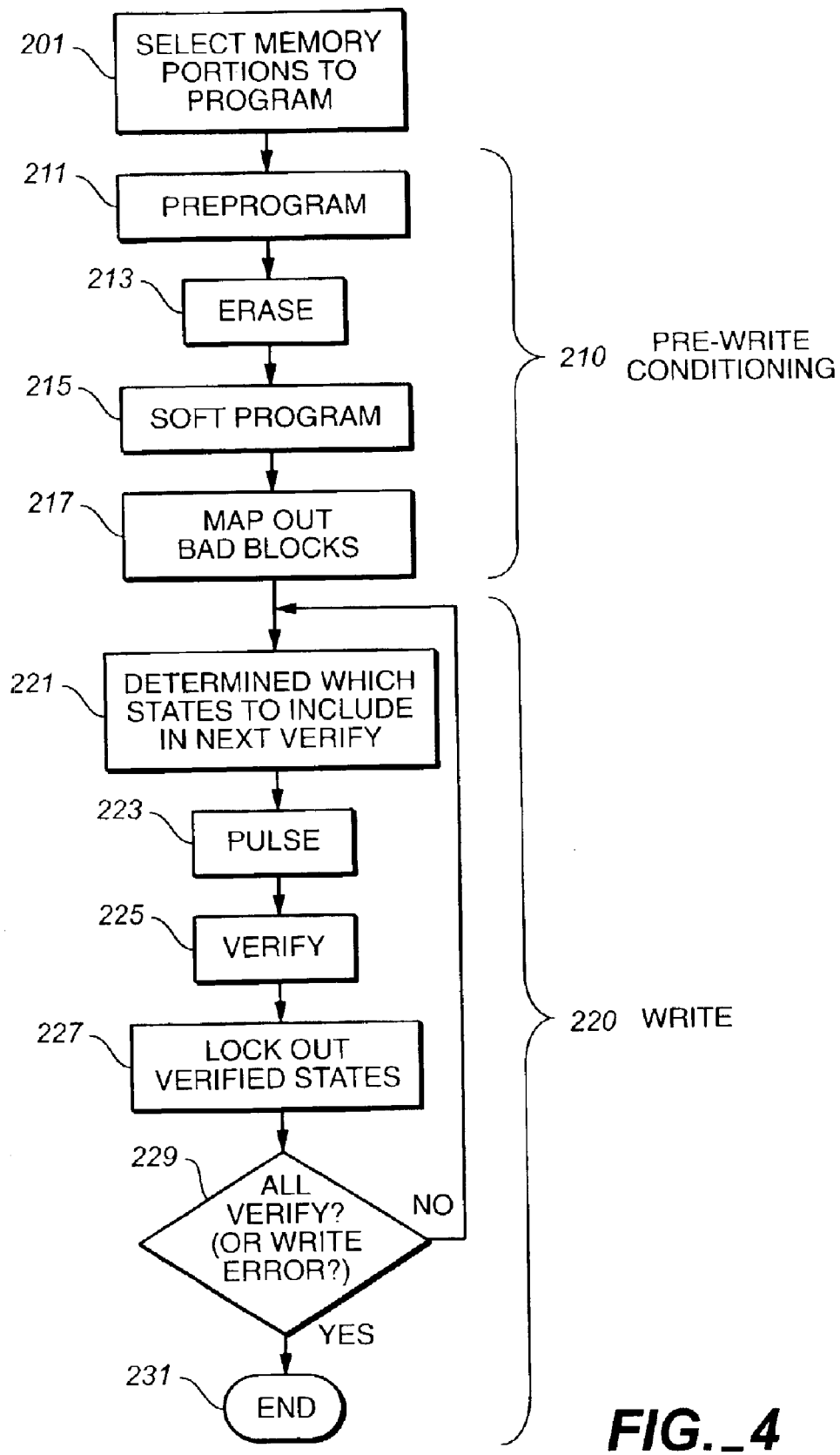
FIG._4

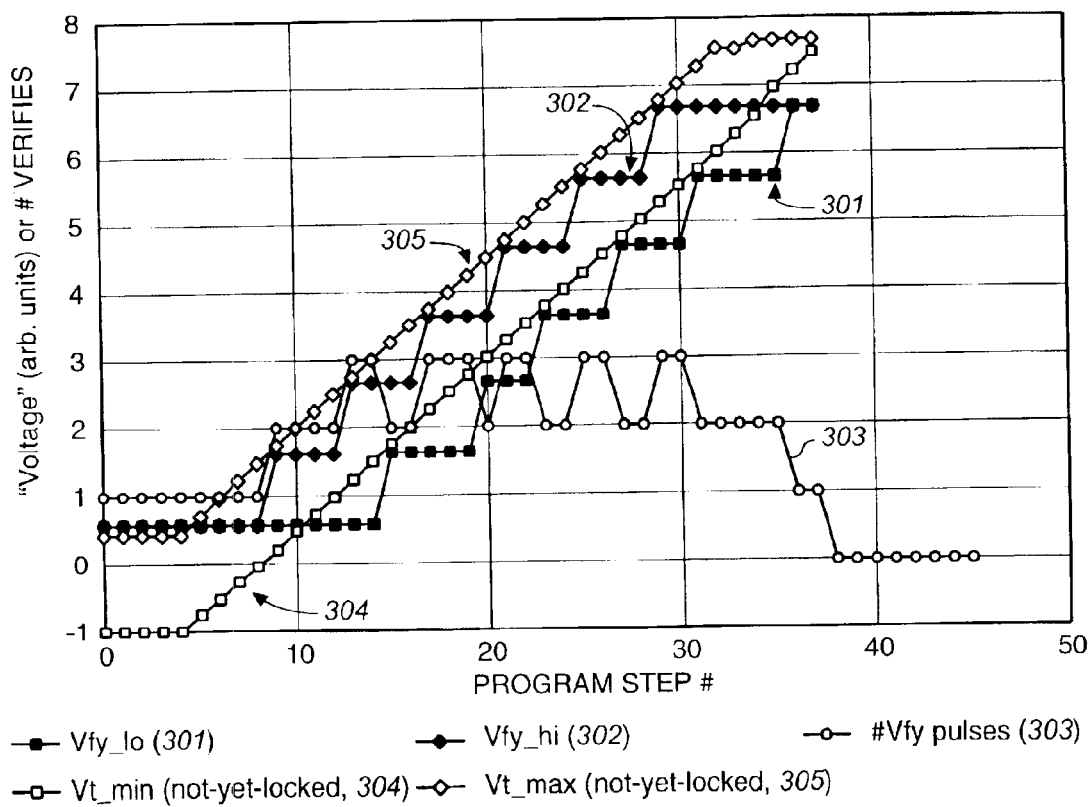
FIG._5a

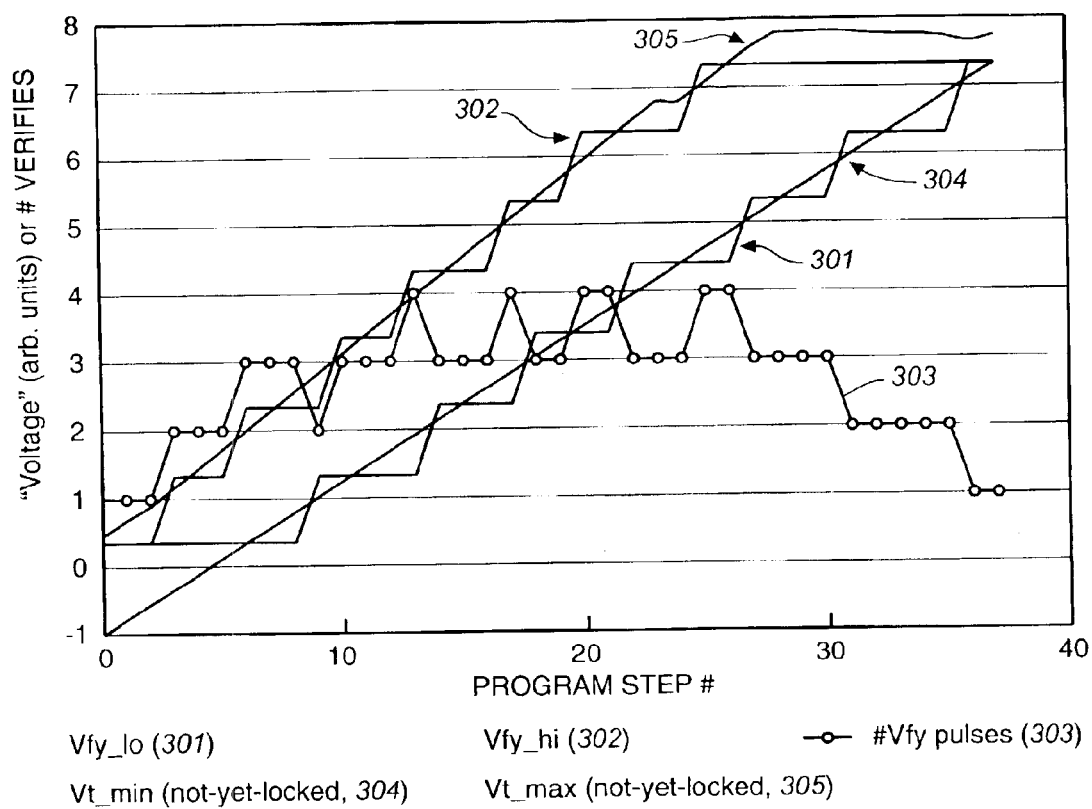
FIG._5b

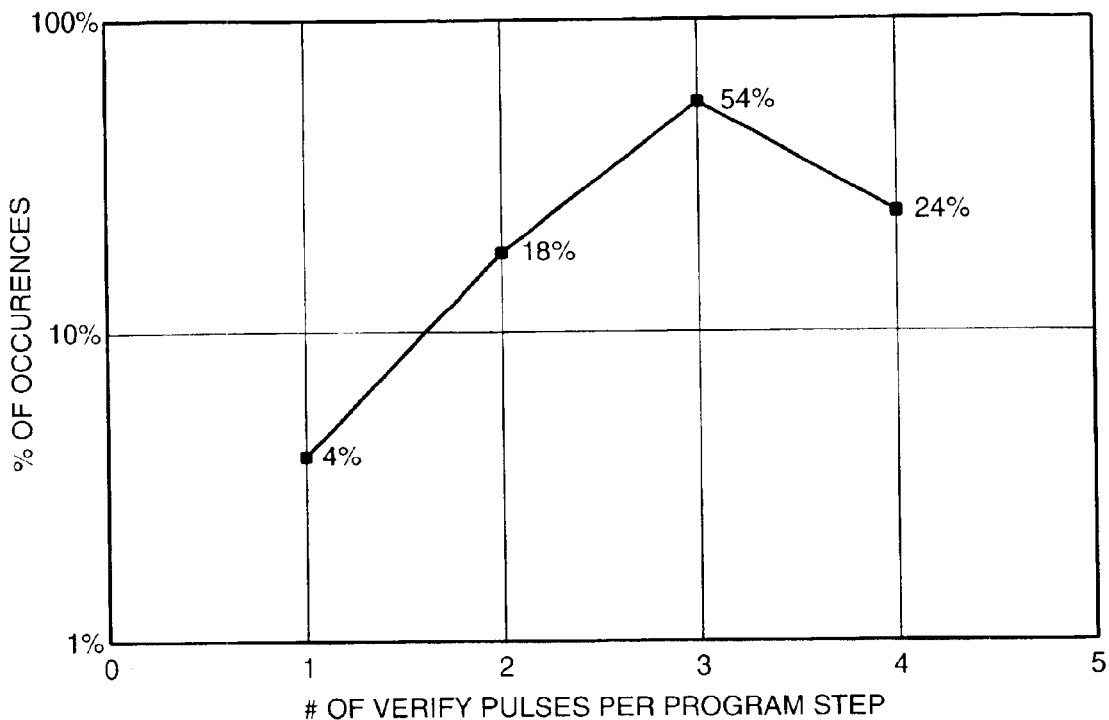
FIG._6
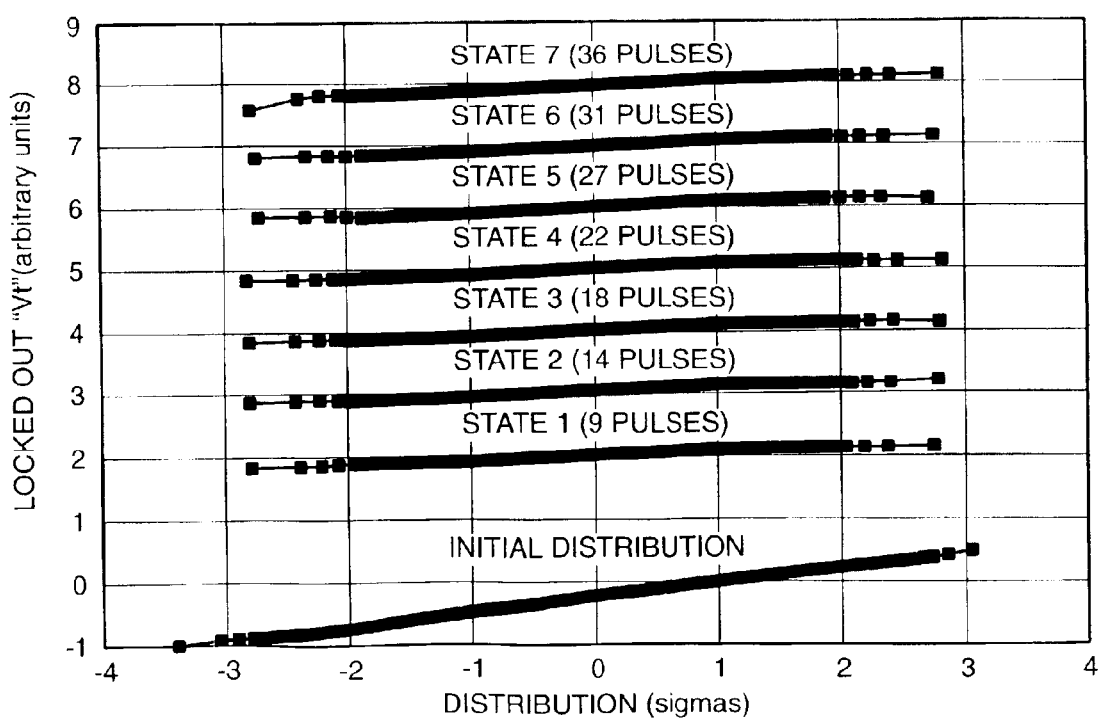
FIG._7

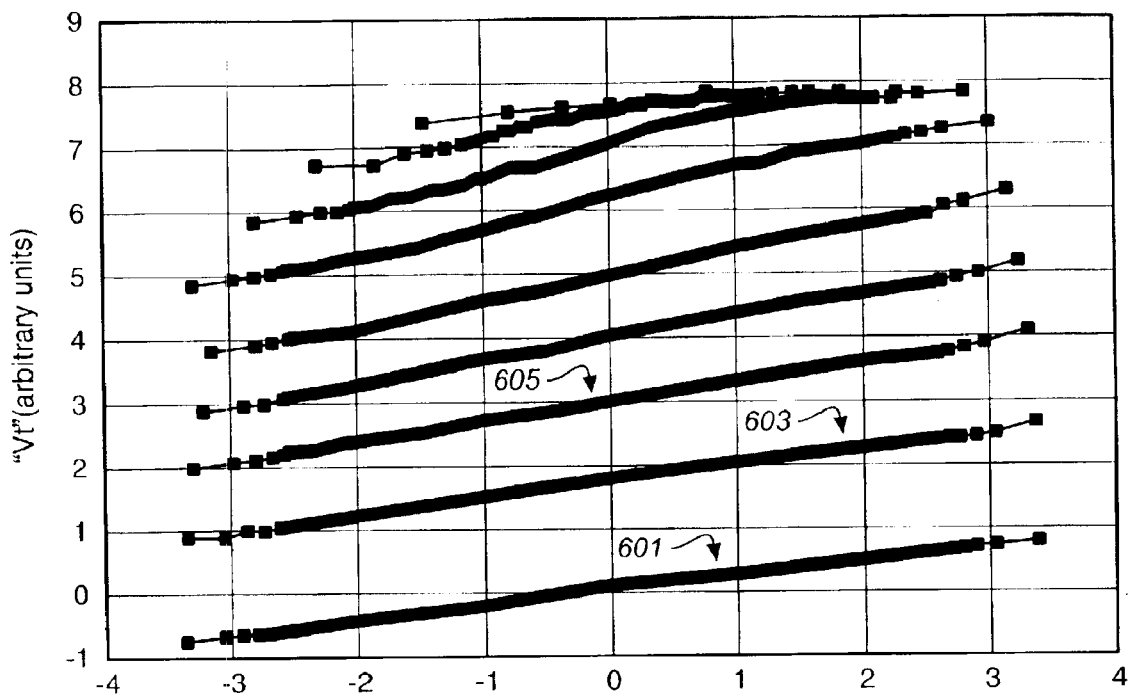
FIG._8
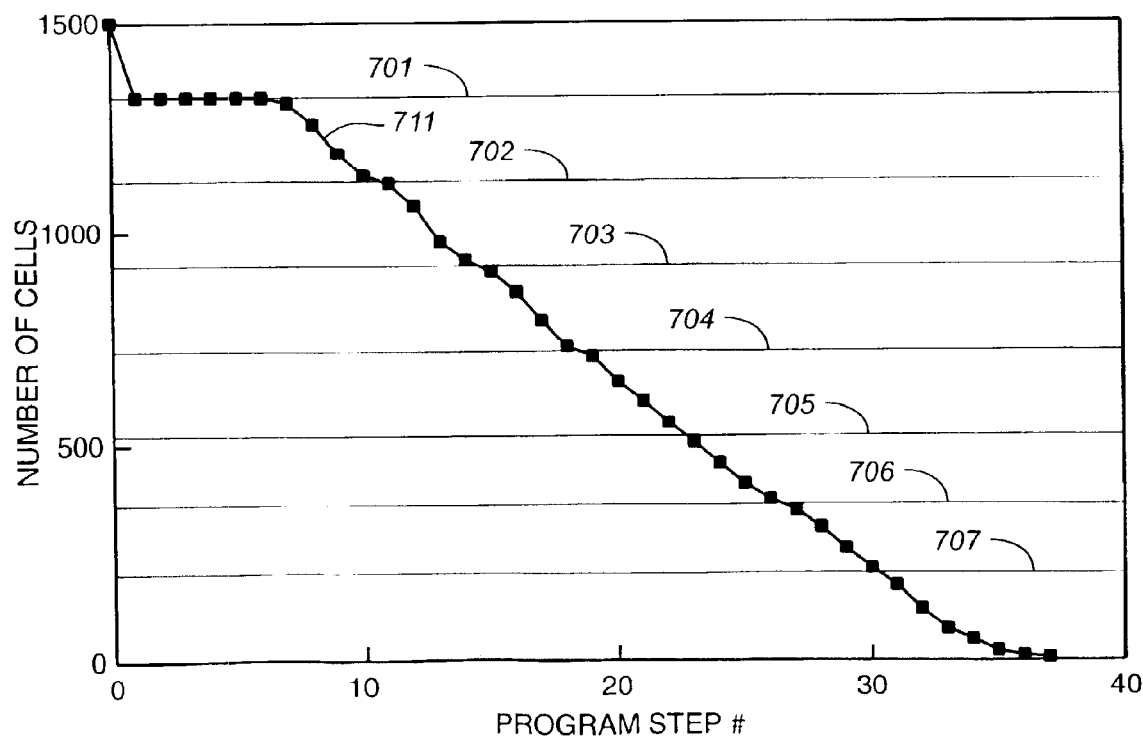
FIG._9

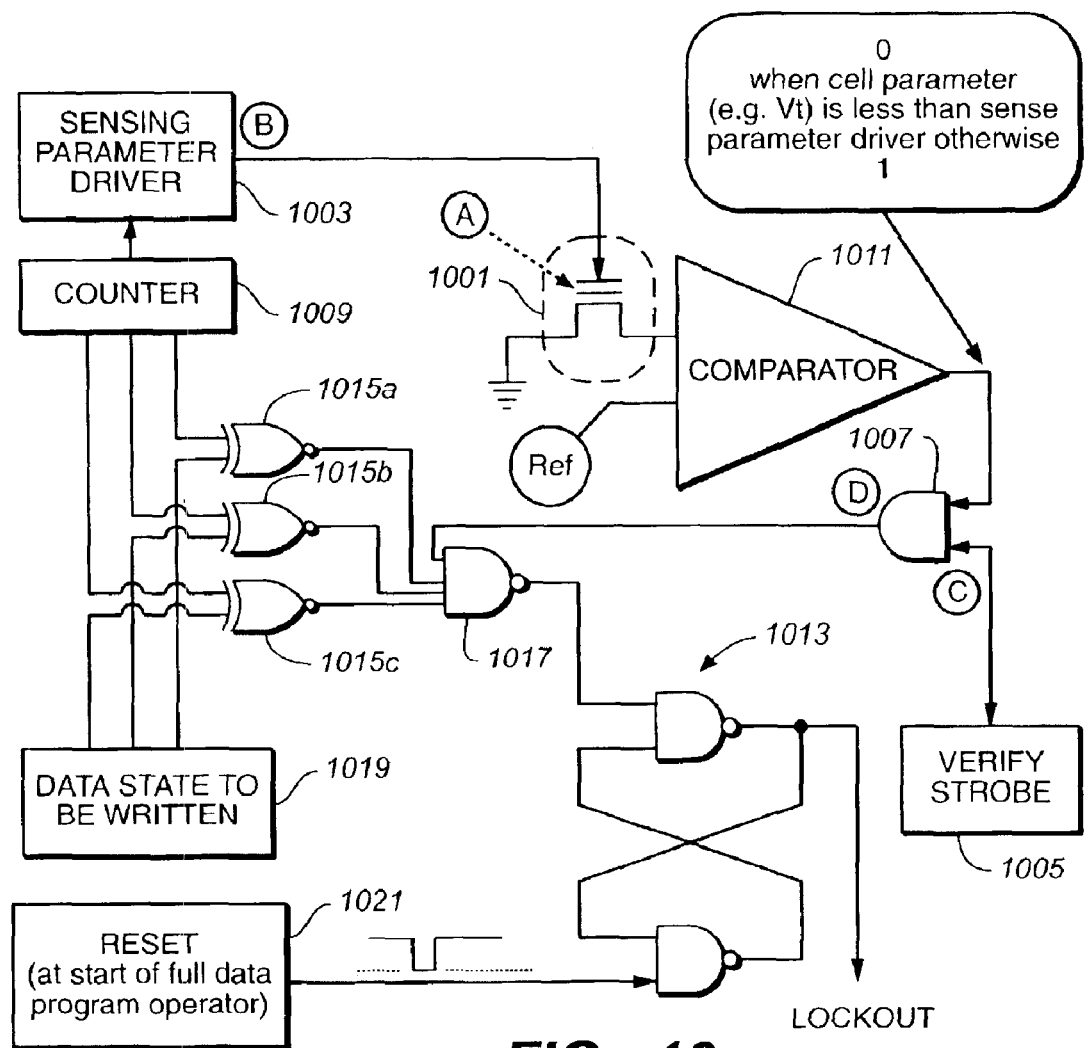
FIG._10

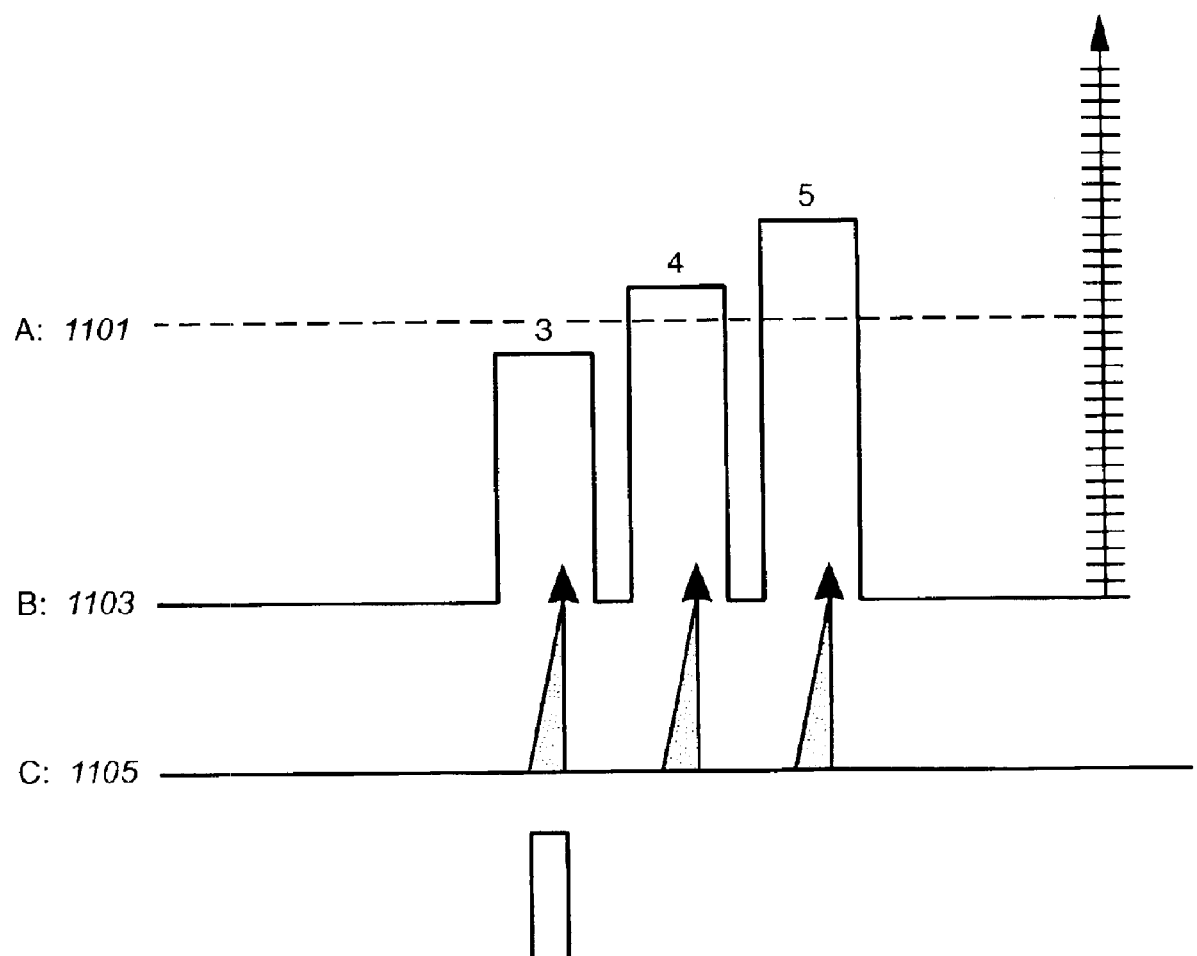
FIG._11

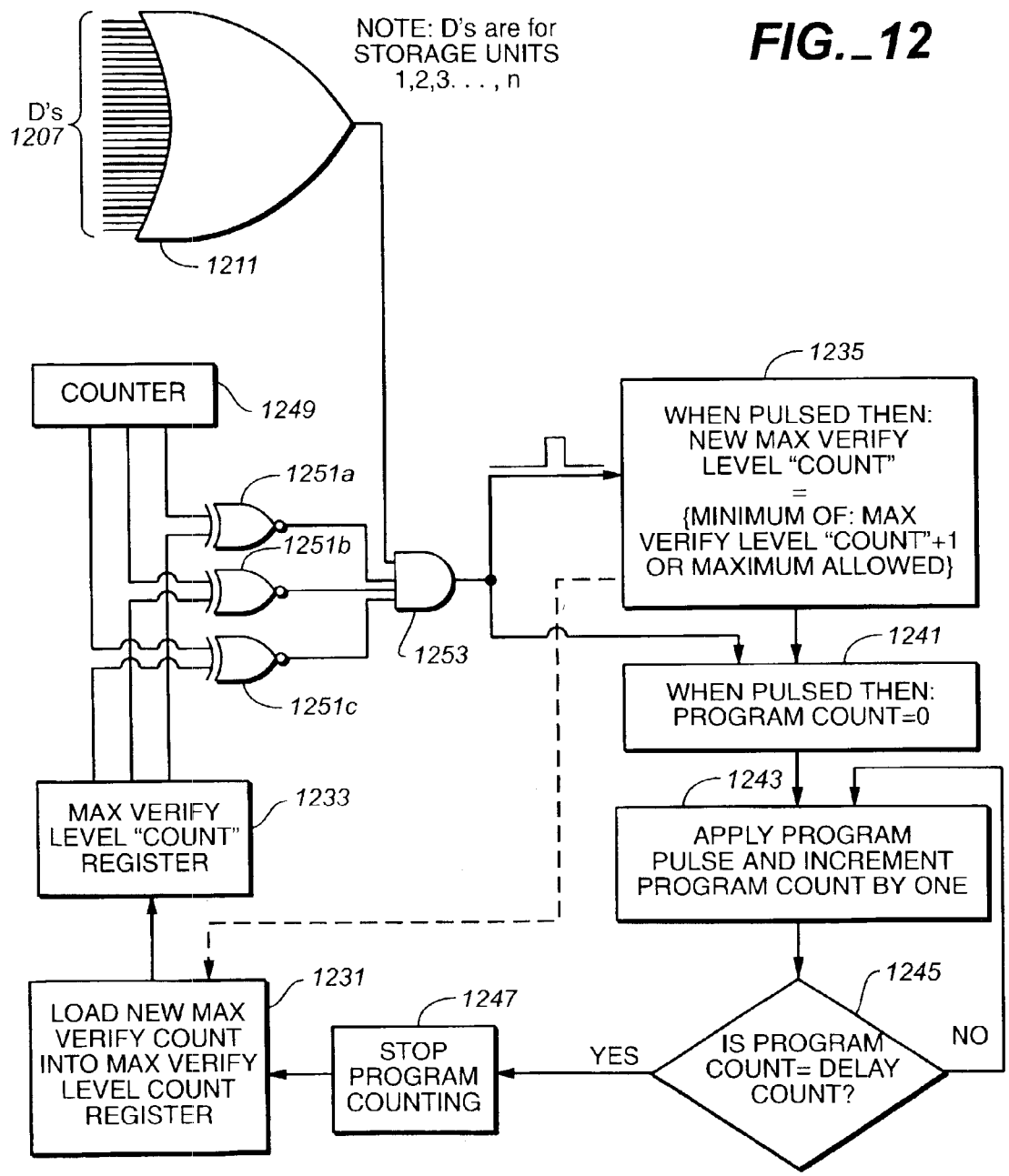
FIG._12

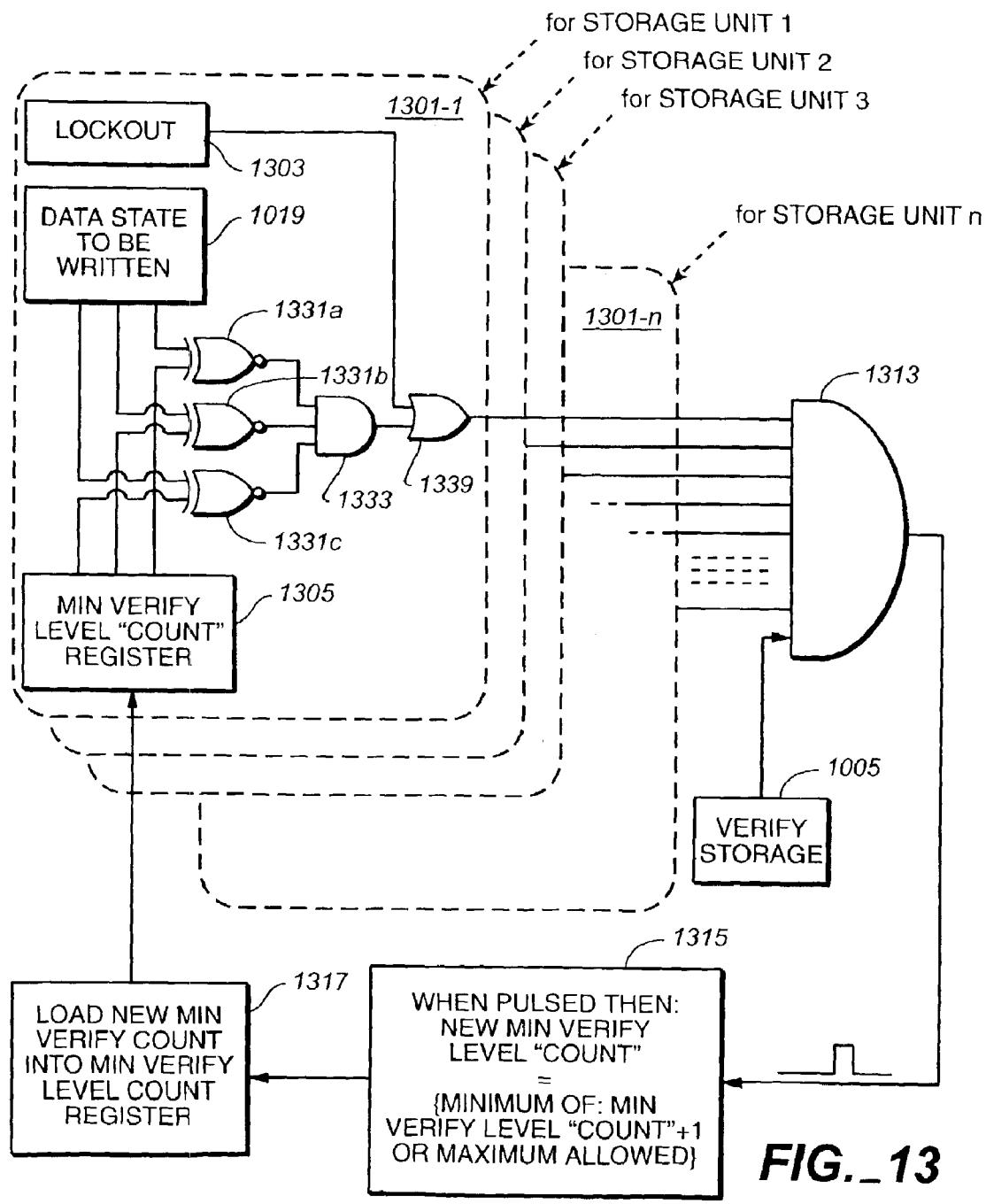
FIG._13

SMART VERIFY FOR MULTI-STATE MEMORIES

BACKGROUND OF THE INVENTION

This invention pertains to the field of semiconductor non-volatile data storage system architectures and their methods of operation, and, in particular, relates to program verify methods.

A number of architectures are used for non-volatile memories. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, 6,103,573, 6,151,248, and 6,426,893 and Ser. No. 09/667,344, filed Sep. 22, 2000 now U.S. Pat. No. 6,512,263.

A NAND array of one design has a number of memory cells, such as 8, 16 or even 32, connected in series string between a bit line and a reference potential through select transistors at either end. Word lines are connected to corresponding control gates of cells across multiple such different series strings. Relevant examples of such arrays and their operation are given in the following U.S. patent application Ser. No. 09/893,277, filed Jun. 27, 2001, now U.S. Pat. No. 6,522,580 that is also hereby incorporated by reference, and references contained therein.

When writing multi-state per storage element data into a non-volatile memory, such as flash electrically erasable and programmable read-only memories (EEPROMs), the write, or programming operation, is typically designed to move a targeted population of storage elements progressively through a series of data states until each element reaches its desired state. This is done by incrementally changing the state of the storage elements, sensing a parameter indicative of this state in a verify process, and further changing the state of those cells that have not yet verified as being in their desired final or target state. In a EEPROM, this typically consists of increasing threshold voltage ($V_{th}$) levels (starting from the erased or 0 state), using a sequentially increasing steering voltage step (e.g. staircase) implementation for each subsequent programming pulse. As each storage element passes through its to-be-written $V_{th}$ data state target, it becomes locked out during the corresponding state verify operation, terminating all subsequent writing to the associated storage elements for the duration of that write session.

A verify operation is a sensing or read operation where the state of the storage unit is compared to its data-associated target value. For a binary storage unit there is only one data state aside from the ground state, while the multi-state case will have additional states. For example, consider the case where each storage element or cell stores a total of 3-bits or eight states. In a common cell array architecture, all cells in a write or sense group being simultaneously respectively written or read are tied to a common control, or steering, gate. In such an implementation, in order to read or verify cells over the range of possible states (e.g. states {0,1,2,3, 4,5,6,7} for the 3-bit example) it is necessary to serially (e.g. sequentially) scan through all the steering voltage sensing conditions. In the example, there are seven such sequential sensing operations for the read operation. These are performed at the seven threshold voltage discrimination levels to simultaneously determine the stored state of the eight possible states for each cell within the full set of cells being read or verified. Using this sort of read operation as applied to the program/verify/lockout sequence, wherein each programming pulse is accompanied with a series of verify steps (along with the associated state conditional programming lockout), this verify set might also proceed sequentially through the full set of steering voltage target $V_{th}$ levels (e.g. set of seven for eight state storage elements), associated with the corresponding set of programmable data states.

FIG. 1 illustrates the basic multi-state program/verify operation for the 8-state case in a flash type memory. Programming pulses, which include incrementally increasing steering or control gate program voltage levels, are interlaced with a 7-step verify sequence of increasing steering gate sensing voltage levels.

FIG. 2 expands this verify series in waveform 103 (also labeled B), labeling the 7 sequentially increasing verify pulses 1, 2, 3, 4, 5, 6, and 7. This example shows the results of such verification for a storage element in the (charged) state (i.e. sensed threshold or $V_{th}$ level) between verify levels 3 and 4, as represented by dotted line 101 (also labeled A) representing either threshold voltage directly or another parameter (e.g. a current level) indicative of this state. The results of sensing at each of the verify levels in waveform for the sensing parameter (such as steering gate voltage) is captured by a sensing strobe, as represented by waveform 105 (also labeled C). The results of this strobed sensing verification is shown in waveform 107 (also labeled D). Whenever the verify level is lower than the stored charge level, this results in a "1" logic level pulse, as shown for the first three verify strobes, whereas when higher this results in a "0" logic level, as shown for the final four verify strobes.

In practice, using this full verify set for each step in the programming is overkill and wastes time (wherein typically each verify sensing operation takes about the same time as a programming pulse), since at any point in the programming progression there will be only a limited $V_{th}$ range (or range of data states) over which the population of cells can span. Present designs exploit this characteristic by providing a limited, sliding range verify set implementation, as described in the following.

Using the progressive programming approach, there is a statistically well-behaved distribution of threshold voltages within a population of cells as they progress through the ascending states, starting with state 1, then to state 2 and so on up to state 7. To help explain the limited verify set concept, it helps to first disregard the data state conditional lockout; i.e. assume no lockout. Given this, an example of one $V_{th}$ distribution scenario for this progression is described in the following snapshot. Starting from the erased state, the population of cells has been successively programmed to a point where a significant fraction of that population lies within the $V_{th}$ range between states 4 and 5. In this scenario there are relatively few straggler that lie between states 3 and 4, and none with $V_{th}$s below state 3. Likewise, there are relatively few cells racing ahead, with $V_{th}$ s between states 5 and 6 (i.e. reading as state 5) and none at states 6 and above. In such a scenario, it is pointless to perform the verify operations searching for states 1, 2, 6 or 7, since at this point the cells only exist in the $V_{th}$ range spanning states 3, 4 or 5. Consequently the approach now in use reduces the range of $V_{th}$ verify levels to span only that window range required to envelop the expected $V_{th}$ range at that given point in the programming sequence. (e.g. in the above example, at this point in the programming sequence only three verifies are performed, spanning states 3, 4 and 5, in place of the full set of seven verifies.) As programming proceeds to higher threshold voltage ranges, the $V_{th}$ verify window range is slid upwards, accordingly. In this way, the programming operation is speeded up substantially. For example in the case for which the time for each programming pulse is comparable to that for each verify step, this approach reduces the total write time in half, from the maximum 8 steps (i.e. 1 programming pulse plus 7 verifies) to 4 steps (1 programming pulse plus 3 verifies), doubling the raw write speed.

An example of this process is illustrated in FIG. 3. This is a schematic representation of which states would be checked at which stage in an exemplary programming process. This can be implemented through a look-up table maintained in the controller or other mechanism. In the table of FIG. 3, the multi-states verified after a given programming pulse are indicated by a checkmark at a corresponding point on the grid. For example, after the first two programming pulses, only the lowest state above ground (e.g. the 1 state) is checked, since it is likely none of the storage elements will have advanced to the 2 state this soon. After the third pulse, a verification of the 2 state is added, since at this point there may be cells arriving at the 2 state. The 3 state is similarly added to the verification list after the fifth pulse and so on. As any cell going to the 1 state is likely to have been programmed by the seventh pulse, the 1 state verify is dropped at this point. Similarly, the 2 state is dropped at the 11th pulse and so on.

Although this reduces the number of reads between programming pulses significantly compared to checking all the non-ground states (for example, 7 reads in the 3-bit example), there are a number of problems with using such a dead reckoning reduced scan, sliding window approach for higher write speed, while maintaining sufficient guard-band to the scan window to insure reliable write operation. These problems mainly relate to the determination of sufficient guard-band. Namely, how soon should each new state be brought in and when is it safe to drop out each state? The verify operation, as exemplified in FIG. 3, must safely cover the operation of the memory regardless of its operating conditions, such as temperature or voltage source, device age, or manufacturing differences associated with processing and other variations. Although performance is increased by checking less states during the verify operation, there must be enough checking to insure robust operation. Furthermore, although the performance improvement benefit does increase with the increasing number of states per storage element by using the above reduced scan, so does room for error, particularly considering the trend to lower operating voltages.

Returning to the cell-by-cell data state conditional lockout, essential to terminating further programming on each cell once its target data ($V_{th}$) state is achieved, this now must take place within the reduced window $V_{th}$ scan. Since the remaining $V_{th}$s are not checked, no lockout of their associated states is possible during that particular programming step. (e.g. In the above example, only cells with data states 3, 4 and 5 have the possibility of being locked out, whereas cells with data states 1, 2, 6, 7 cannot be so locked out during that specific programming/verify step). Therefore a critical requirement for this verify speed-up algorithm is that, at any time in the programming sequence, a sufficiently wide and properly positioned verify window range is established to cover the spread of the expected $V_{th}$ distribution (excluding those cells already locked out).

In the case of inadequate verify span window, cells at both ends of the Vth distribution (i.e. both those which program too slowly or too quickly) may be missed when they in fact do achieve their proper $V_{th}$ levels and require the programming lockout. This will inevitably lead to corresponding data state error (i.e. write failure), as those cells proceed to higher still $V_{th}$ levels (never having been locked out in the case of the laggards, or having locked out too late, the likely fate for the speeders.) Consequently, the reduced $V_{th}$ scan window algorithm (i.e. its window size and program step dependent placement) must be carefully tailored to achieve increased write speed without degrading write reliability.

An alternate existing approach for reducing the number of verify operations per programming pulse has been developed for a 2-bit per cell NAND architecture (whose four states, for referencing purposes, are designated here as 0, 1, 2, 3, in ascending $V_{th}$ level), as described above in relation to U.S. patent application Ser. No. 09/893,277, filed Jun. 27, 2001, now U.S. Pat. No. 6,522,580, that was incorporated by reference above. One optional operating mode for this NAND implementation logic treats each storage unit as having multiple sector addresses, each address storing one of the two bits of the storage unit, rather than a single storage unit storing multiple bits within one sector address. In the case in which the higher two $V_{th}$ states (2, 3) are to be programmed up from the lower two $V_{th}$ states (0, 1) the operation goes as follows: Cells targeted to both states 2, 3 are first programmed and locked out to the lower $V_{th}$ of those two higher states (i.e. state 2). This is accomplished using only a single verify-2 operation following each programming pulses, locking out further programming of both 2s and 3s as they pass that verify-2 level. Once all 2s and 3s have so locked out, the 3s are then automatically unlocked, and the programming sequence restarted on those 3s, but now with the single verify operation set at the verify-3 level. A variation begins with a 2s only verification during the concurrent programming of the 2 and 3 states. The 3 state's verification is added after a predetermined number of programming pulses, with the 2s verify eventually dropped out to leave only the 3s verify from then until completion. Various aspects of this process are discussed more in U.S. Pat. No. 5,920,507, which is hereby incorporated by reference.

This approach could be extended to greater levels of multi-state storage (e.g. storing 8 states per storage element), by locking all cells targeted for a $V_{th}$ equal to or greater than a target $V_{th}$ level (i.e. state), using a single verify at that targeted $V_{th}$ level. Once all cells are so locked out, the operation is repeated for the cells targeted at the next higher Vt state or beyond, repeating this loop until those cells targeted for the highest data state pass their corresponding verify target.

Using this approach, only a single verify pulse is required with each programming pulse operation, a definite plus in systems whose verify times dominate those of programming, thereby offering an optimal write performance solution. However for systems whose single pulse programming times are comparable to those of single verifies, typical of existing mass storage FLASH memories, the above approach actually reduces write performance, for two reasons: (1) The programming progress of cells targeted for states above that being verified are stopped prematurely and unnecessarily, dictating additional programming time in subsequent $V_{th}$ programming phases to make up for the progress lost by this early termination; (2) The initial programming conditions (e.g. steering, or control, gate voltage staircase starting level) upon resumption at the next higher state must be dropped back to a lower value from that left off at the end of the previous programming sequence. This drop-back is essential in order to insure that cells do not overshoot their target range, since the specific, appropriate level that the each cell of the population had previously locked out at (and from which corresponding level each cell should resume programming) can no longer be applied to the cells, as a population, in a single program starting condition. At best the starting condition needs to be reduced to that associated with the fastest programming cell (i.e. the programming voltage set for the first cell in the group to have locked out at), thereby increasing the required number of programming pulses for the remaining cells. For safety margin, the starting voltage should be reduced somewhat below that optimal level, increasing the number of programming pulses further still, degrading write performance. This approach also re-introduces the issue of coming up with a fixed (i.e. non-intelligent/adaptive) value (in this case for re-starting programming) which balances performance with reliable write. If pushed too aggressively in favor of increased write speed, this risks programming state overshoot, whereas if too conservative, write speed suffers.

In view of the limitations of existing program/verify approaches, the following section discusses an improved approach which can adaptively/dynamically satisfy this combined requirement of fast write performance while insuring write reliability.

SUMMARY OF THE INVENTION

According to one principal aspect of the present invention, briefly and generally, multi-state memories are programmed using a "smart verify" technique with a verify-results-based dynamic adjustment of the multi-states verify range for sequential-state-based verify implementations. The "smart verify" technique can increase multi-state write speed while maintaining reliable operation within sequentially verified, multi-state memory implementations. It does so by providing "intelligent" means to minimize the number of sequential verify operations for each program/verify/lockout step of the write sequence. In an exemplary embodiment, by monitoring population movement to detect both the fastest programming cell, via data unconditional verification at the highest data state level covered in the verify scan range, as well as the all-cell-lockout condition for the lowest data state covered in that scan range (thereby encompassing the slowest programming cells), the scan's low and high ends of the threshold voltage scan window can be reliably established, with minimum time wastage from extra, unneeded verify operations.

In an exemplary embodiment of the write sequence for the multi-state memory during a program/verify sequence of the selected storage elements, at the beginning of the process only the lowest state of the multi-state range to which the selected storage elements are being programmed is checked during the verify phase. For example, the storage elements may be the memory cells of a flash EEPROM memory that are pulsed with a programming voltage and subsequently sensed to monitor their progress. Once the first storage state is reached by one or more of the selected elements, the next state in the sequence of multi-states is added to the verify process. This next state can either be added immediately upon the fastest cells reaching this preceding state in the sequence or, since memories are generally designed to have several programming steps to move from state to state, after a delay of several cycles. The amount of delay can either be fixed or, preferably, use a parameter based implementation, allowing the amount of delay to be set according to device characteristics.

The adding of states to the set being checked in the verify phase continues as per above through the rest of the multi-states in sequence until the highest state has been added. Similarly, lower states can be removed from the verify set as all of the selected storage elements bound for these levels verify successfully to those target values and are locked out from further programming. Additionally, previously identified defective cells that are unable to program properly can also be mapped out (e.g. by locking them out initially) eliminating their impact on the program/intelligent verify operation.

Additional aspects, features and advantages of the present invention are included in the following description of exemplary embodiments, which description should be read in conjunction with the accompanying drawings.

BRIEF DESCRIPTION OF THE DRAWINGS

FIG. 1 is a program/verify waveform sequence showing a full 7-verify sequence alternating with a progressively higher steering program voltage.

FIG. 2 shows a full sequential 7-step verify sequence.

FIG. 3 is an illustrative example of a look-up table for which states are to be verified after a given programming pulse.

FIG. 4 is a flow chart for an exemplary embodiment of the present invention.

FIGS. 5a and 5b plot the number of verify pulses applied following each programming step in a simulation of two embodiments of the present invention.

FIG. 6 shows the distribution of occurrences for the range of number-of-verify pulses used in the embodiment of FIG. 5b.

FIG. 7 shows the resulting simulated threshold distributions for the programming states following lockout.

FIG. 8 shows the resulting simulated threshold distributions for the cell population not yet locked out at programming steps just prior to locking out each of the programming states.

FIG. 9 plots the number of cells still to be programmed to their corresponding verified/locked-out conditions as a function of the number of cumulative programming pulses.

FIG. 10 is a schematic of a program related verify/lockout implementation.

FIG. 11 shows a reduced sequential 7 step verify sequence illustrative of smart verify operation.

FIG. 12 is a schematic of peak verify level detection and application for establishing high voltage end of smart verify operation.

FIG. 13 is a schematic of minimum verify level detection and application for establishing low voltage end of smart verify operation.

DESCRIPTION OF EXEMPLARY EMBODIMENTS OF THE INVENTION

The various aspects of the present invention are applicable to non-volatile memory systems in general. Although the description below, as well as that in the Background, is given mainly in terms of an EEPROM Flash memory embodiment, the particular type of storage unit used in the memory array is not a limitation to the present invention. The particulars of how the storage elements are read, are written, and store data do not enter in to the main aspects of the present invention and can be those of any of the various non-volatile and volatile systems which likewise us sequential verification through state conditions to perform the cell by cell verify/program terminate operation.

According to a principal aspect, the present invention uses verify-results-based dynamic adjustment of the multi-states verify range to establish a reliable, minimal time wasting multi-state write operation in sequential verification implementation. This provides a higher speed verify algorithm while maintaining proper write reliability for sequential sensing/verification of multi-state storage. For example, when programming multi-state storage elements from state 0 sequentially through states 1, 2, and so on, at an early stage only the 1 state will be verified. When the faster programming cells begin to verify at the 1 state, state 2 will be added to the verify state range, perhaps with a lag of a number of program/verify cycles that can be parameter based. The other states can similarly be added to the verify set as programming progresses to higher state levels. Lower lying verify levels can be removed when the full set of storage elements targeted to be set at these lower levels do so verify. Consequently this verify results based dynamic adjustment improves upon the dead reckoning reduced scan, guard-banded sliding window approach described in the Background section by allowing a minimal number of verifies while insuring adequate verify range coverage. Generally speaking, the greater the number of states, the greater the improvement realized by the present invention.

The various aspects of present invention can be implemented in various non-volatile memories such as those incorporated by reference in the Background. More details of sensing processes are presented in U.S. patent application Ser. No. 09/671,793, filed Sep. 27, 2000, now U.S. Pat. No. 6,538,922 Ser. No. 10/052,888, filed Jan. 18, 2002, now U.S. Pat. No. 6,621,739 and Ser. No. 10/052,924, filed Jan. 18, 2002, now U.S. Pat. No. 6,850,441 which are hereby incorporated by reference. Although the exemplary embodiment is described in terms of verifying voltage values, as the threshold voltage is the relevant physical quantity of a floating gate type memory cell, the verification can be based on the use of other parameters indicative of the state of the storage element, such as current or a frequency. A number of these variations are described in these references. Furthermore, the various aspects of the present invention can be combined with the use of read and verify margins as described further in use of U.S. Pat. No. 5,532,962, which is also hereby incorporated by reference.

The basic idea of verify-results-based approach is to provide and use information relating to the progress of programming of the population of cells to thereby dynamically establish the appropriate and reliable span for the $V_{th}$ (or other parameter) scan window. Starting from the erased or ground state (state 0), the first piece of useful information is knowing when the fastest programming storage element or cell of the set of cells being programmed crosses the next lowest data state's (e.g. state 1) $V_{th}$ target of that set (i.e. following the concept of a peak $V_{th}$ detector). Therefore, until such crossing is detected, only a single verify pass, for this lowest level, needs to accompany each programming pulse. Up to this point, the data conditional aspect of $V_{th}$ detection is preferably defeated, which is to say that the full population of cells participates in the peak threshold voltage detection, independent of their corresponding targeted data states. In other words, this information must be known independent of the target state of that fastest cell. Once so detected, then the data conditional verify and lockout is performed for a limited range of data states above this value (e.g. up to one verify $V_{th}$ step above this lowest level).

Continuing with the process, another piece of useful information is the determination that all cells targeted for this lowest data state have in fact completed verification/lockout. Once this is known, the verify operation for that lowest state is no longer needed and can be safely eliminated. This signals a shifting up of the bottom of the $V_{th}$ scan window to the next higher $V_{th}$ data state; for example, if states 1, 2, 3 were being verified, this would then shift to states 2, 3. This strategy could then be continued as each population of cells targeted at the existing lowest state verify complete their associated verification/lockout. This provides a way of reliably eliminating time wastage for verifying the lower end of the verify range, as well as a gauge for dynamically positioning the $V_{th}$ window scan.

A possible approach could use this lower state removal condition exclusively in making the determination of when to increment the higher state verify. In such an approach, however, there is still the risk of excessively fast programming cells racing beyond the above determined high end range of the $V_{th}$ scan, thereby missing the opportunity to provide lockout. To reduce this risk, one option is to add a guard-band to the high range of the $V_{th}$ scan, thereby reducing the likelihood of such occurrence. The price of such an approach, however, is reduced write performance because of frequent unnecessary verifications at the high $V_{th}$ end.

The way to circumvent this problem completely is to provide information relating to the highest cell $V_{th}$ at any given time. This is the concept introduced above; namely means to determine when the fasted programming cell of the full cell population crosses a given $V_{th}$ verify level, independent of its target data (the peak $V_{th}$ detector). With this means applied at any time to the highest $V_{th}$ range being checked (which should span one state higher than that expected to exist in the population $V_{th}$ distribution), then once such crossing is signaled, the verify $V_{th}$ high end is incremented to the next higher level. This means is then repeated at that new level following the next pulse. (Note, as before, if the targeted data for this fastest cell or cells does in fact match the aforementioned highest verify level, they will then be locked out as well.) In this way, as with the lower end of the $V_{th}$ scan range, the upper end of that scan range is adaptively adjusted as well, based on information relating to the fastest programming cell at any time (i.e. step) in the programming sequence. More generally, the adding of higher states to the verify scan window is an independent process from removing lower state verifies as these lower states fully lockout.

At first glance this peak $V_{th}$ detector approach appears to reduce write speed by forcing one additional verify at the high end, which by intent is targeted to not find its associated $V_{th}$ the majority of the time; however, in the long run it pays for itself, since the alternative of blind guard-banding to insure reliable write operation for the existing sliding window approach will very likely dictate wider still window enveloping.

In order to improve operation further still, an alternative is to not add the next state to the verify set immediately upon the fasted programming state verifying at the preceding state. There is no need to rush to include the next higher verify level since, by design (e.g. as governed by the steering gate's program voltage staircase), it will commonly take a number of program pulses for even the fastest programming cells to reach this next higher state level. For example, if by design it takes four programming pulses to proceed from one storage state to another, one could safely wait for one or two program pulses beyond the peak detection point, before adding then next verify level. The actual lag amount can either be fixed, or in an exemplary embodiment use a parameter based implementation. The parameter can then be set according to operating conditions, device age, and other factors to improve performance while still allowing a sufficient safety margin. For the simulation example to be described below, this lag can gain an additional 10% or so in write speed without incurring unacceptable risk.

The entire sequence for this approach goes on to completion as in existing implementations, ending at the earlier of: [1] all cells having locked out, or [2] at the end of the (staircase) programming sequence, in which case a flag is raised signaling this condition. A simulation based capability of this approach for a particular embodiment is detailed below, which doubles the raw write speed without incurring risks of the above-mentioned prior art (i.e. "non-intelligent") verify pulse reduction schemes.

FIG. 4 is a flow chart for an exemplary embodiment of the present invention and begins with step 201, where the portion of the memory to be programmed is selected. This will be one or more of the write units appropriate to the memory structure, where the write unit is referred to here as a page. Once the storage elements to be written are selected, they typically undergo a data unconditional pre-write conditioning phase 210.

The phase 210 is a representative erase process which may optionally include soft programming, preprogramming, erasing, soft erasing, and/or other conditioning steps (as is appropriate for the type of storage unit), to get selected storage elements ready for a data write. The exemplary embodiment shown here is taken to contain steps 211, 213, 215, and 217.

Step 211 is a pre-programming process that is sometimes used wherein, prior to erase, the addressed storage elements are given non-data dependent programming by raising all their corresponding word-lines, for example, to level out storage element wear and provide a more uniform starting point for the erase. Step 213 is the erase process, such as those described in the cited references incorporated above, appropriate for the type of storage unit being used. A particular example is the smart erase process suitable for a flash EEPROM memory is described in U.S. Pat. No. 5,095,344. Step 215 is any soft-programming or similar operations designed to put the erased storage units into a more uniform starting range for the actual write phase. If any of the storage units fail to verify during erase (or during soft programming if it features a verify), they can be mapped out of the logical address space at step 217 and replaced by a properly operating storage units. Again, the actual steps and their execution for phase 210 will vary according to the particular memory and its requirements.

At this point, the memory is ready for the write phase. The write phase 220 causes a series of incremental changes to the level of the parameter representing the data state of the storage element, the result of which is then checked, and as the storage elements do verify to their target data states, they get removed from the process. This process is largely as found in the prior art, but differs from the prior art in step 221.

Following the setting of the initial verify range of step 221, for the exemplary embodiment of a charge storing memory element (e.g. EEPROM or flash), the actual writing begins in step 223 with a programming pulse. The pulse can vary in duration, voltage level, or both with each iteration of the loop 220 as is known in the art. There may also be several initial pulses before the first verify, where the particular number can be a parameter based implementation. Step 225 senses the state of each of the elements pulsed in the previous pulse in relation to the verify levels, over the targeted range of levels for the states to be verified, initially encompassing only the lowest programming state. At each verify level it compares the measured parameter of each element against its associated data target value. In this way, each of these elements is so compared over the range of verify states established for that iteration of the loop 220: In the prior art this may include all of the possible states, or it may consist of a subset based on the number of loop iterations using a look-up table or similar implementation, as described in the Background section. According to a principle aspect of the present invention, the set of verify levels used is determined in step 221 by the verify results of the previous iteration. The initial verify set of states can be taken as only the lowest state or possibly even have no verifies, and can be based on a settable parameter. (Although in the present discussion the verify set is taken as a proper subset of the full set of target values, there may arise cases where the subset is coincident with the full set, particularly when the number of multi-states is small.)

In step 227, all elements that pass the verify condition with respect to their target state are locked out. Step 229 determines whether all of the elements being programmed have verified to their target data values. If so, the process ends at step 231; if not, the process returns to step 221. More generally, some elements may fail to program, as determined in step 229, resulting in a write error, in which case the bad elements or blocks can be mapped out.

Step 221 determines which states to include in the next verify operation based upon the results of step 225 as well as a step 227 to the extent that the lockout condition is used for such determination. As has been described above, this is a major aspect of the present invention. Although the look-up table type of embodiment, described in the Background section with respect to FIG. 3, could also determine at this stage which states to include in the next verify operation, in that case the determination would be based solely on the current iteration of the loop in the write process 220, whereas here it is based on the verify result of step 225 (and potentially step 227). Depending on the results in step 225, step 221 adds higher states to be verified, as needed. Likewise, in conjunction with step 227, it removes lower state verifications as the elements being programmed to those lower states all verify and are locked out (or were determined to be bad cells and are mapped out). Once the verify set is re-established at step 221, the process again continues to step 223.

FIGS. 5–9 show results of simulation of the "smart verify" process for the exemplary memory embodiment, wherein the storage unit is a memory cell storing 8 states. A specific example of a non-volatile memory in which this method may be implemented is described in U.S. Pat. Nos. 5,712,180, 6,103,573 and 6,426,893 and U.S. patent application Ser. No. 09/667,344, now U.S. Pat. No. 6,512,263 all incorporated by reference above. Further details on an exemplary embodiment follow the discussion of the simulation.

The "smart-verify" algorithm was simulated to move a population of 1500 8-state cells from the ground or erased (0) state to targeted program data states (1,2,3,4,5,6,7). In order to facilitize this simulation, all voltage levels are given in arbitrary units, with target threshold voltage "$V_{th}$" levels for states 1,2,3,4,5,6,7 set at values 2,3,4,5,6,7,8, respectively. The starting $V_{th}$ distribution for the entire population was set to be a normal distribution with a one-σ value of 0.22 centered at −0.25, resulting in an initial $V_{th}$ spanning −1 to +½. The average programming speed per programming step was set at 0.25, resulting in cells moving from one state to another in about 4 steps (and thereby allowing an entire locked out distribution for each programmed state to be confined to around that one step value). However, in order to reflect some small cell to cell variation, a spread in speeds was incorporated, which follow a normal distribution with one-σ equal to 0.015 centered at the average 0.25 speed value, resulting in speeds spanning the range 0.2 to 0.3 $\Delta V_{th}$ per step. Throughout the entire simulation, the speed value assigned to any given cell remained unchanged. It should be noted that the assumption of a constant speed value for a given cell may not apply t all storage technologies, but in any case it is not required for the present invention to effective.

In practice, when using a uniformly increasing stepped voltage (applied, for example, to the steering gate in the exemplary memory structure) for the each subsequent step of the programming waveform, average programming speed of all cells will be more or less identical. This speed will closely match that of that above staircase program voltage stepping, once a steady state programming condition has been reached, typically within the first 6 program pulses. Consequently, use of an artificial spread in speeds is very likely a worse case condition than that which would occur in practice. Despite this, as will be seen, it presents no problem to the smart verify methodology.

The assignments of starting $V_{th}$, target data state, and speed for each cell of the 1500 cell population was done via a random-number-based shuffling, with independent shuffling for $V_{th}$ distribution, data state, and speed assignments. The number of cells assigned to each of the eight states was roughly the same (~188 cells per state on the average). The entire population of to be programmed cells (i.e. states 1,2,3,4,5,6,7 with 0 being locked out), were then moved through the program verify sequence, using the "smart verify" sequence and criteria. The results of this simulation are shown in FIGS. 3–7.

The graph of FIG. 5a plots the number of verify (vfy) pulses or steps (303) applied to the cell population following each programming step, per the smart verify algorithm. Also shown are the minimum (Vt_min, 304) and maximum (Vt_max, 305) $V_{th}$s of the cell population not yet locked out, as well as the low (Vfy_lo, 301) and high (Vfy_hi, 302) verify voltage levels applied following each program step. The process begins with a number of pulses to bring the cells into a steady state before the threshold values begin to move up. The first few program pulses require only the lowest state verify, during which the $V_{th}$ distribution programs up to that verify point. Thereafter, the number of verifies increases, plateauing at around the two to three verify pulse level, and dropping back down towards the one verify condition as the last few states are programmed to their corresponding targets (with all states verified and locked-out at around program pulse number 37). Throughout this sequence, the low and high verify limits of the sequential verify scans are adaptively adjusted (based on the all-lowest-state-cells verified/locked out condition and the peak $V_{th}$ detection criteria, respectively) to intelligently and reliably span the appropriate, optimal data state $V_{th}$ range, per the smart verify logic criteria.

The utility of such an intelligent verify scan methodology is clear when looking at the complexity of what is taking place. For example, even though two verifies are enough much of the time, there is also the need to have three verifies some of the time and also possibly even require a four level verify on occasion, without which there is risk of write failure. Furthermore, it is unlikely that any tightly controlled non-adaptive, dead reckoning implementation could precisely follow the optimal transitions of Vfy_lo and Vfy_hi (i.e. sliding verify window), without getting into trouble. Consequently, in order to insure a reliable write operation, the non-adaptive verify window range described with respect to FIG. 3 would likely have to be guard-banded to 4 and possibly 5 verify levels per programming pulse, substantially degrading its performance advantage. Furthermore, the ability to aggressively match the adaptive approach's ability to use fewer verifies (going down to the one verify level) in the initial and final portions of the programming sequence is difficult to envision in a non-adaptive implementation.

The embodiment of FIG. 5a includes a delay of two program steps following the fastest programming cells' verify at the existing maximum state verified, before adding the next state to the verify set. For example, at program step 5 the Vt_max line 305 begins to move and crosses the "Voltage"=1 line of state 1 at step 6; however, only the 1 state is verified for a further two steps with the 2 state being added to the verify set at step 9, as is shown by the number of verifies (#Vfy pulses, 303) moving up to 2 at this point. The entire process is complete after step 37, including the initial five program steps.

FIG. 5b is similar to FIG. 5a, but for the embodiment without the delay prior to adding the state to the verify set and without the initial five program steps. For example, after the Vt_max line 305 crosses the "Voltage"=1 line of state 1 at step 2, the 2 state is added to the next verify set without delay. In this case, for most of the process there are three verifies per step, with occasional need of four verifies. This process is not as fast as that of FIG. 5a, requiring a total of 100 verifies instead of 83 (if the initial four pulses of FIG. 5a are neglected for comparison). The embodiment of FIG. 5b is discussed further with respect to FIGS. 4–7.

FIG. 6 shows the distribution of occurrences for the range of number-of-verify pulses used in the embodiment of FIG. 5b. While the 3-verify condition dominates, i.e. half of the time, the ability to drop to 2 verifies does occur about a quarter of the time, as does the need to increase to 4 verifies. On the average, around 2.7 verifies are needed per programming pulse, a figure that drops to under 2.5 for the embodiment of FIG. 5a. Assuming that the time required to perform one program operation (or step) is comparable to that for one verify operation, then, in the example of FIG. 5b, the smart verify algorithm is capable of safely reducing the overall program time to 46% of the time that a full 7-step verify would require. Thus, raw programming speed roughly doubles.

FIG. 7 gives a snapshot of the resulting simulated $V_{th}$ distributions ("Vt") for each of the seven programming states following their lockout, as well as the starting erased or 0-state distribution, for the embodiment of FIG. 5b. The distributions of each are reasonably well confined to the expected 0.25 arbitrary unit $V_{th}$ range, as dictated by the algorithm.

FIG. 8 gives a snapshot of the resulting simulated $V_{th}$ distributions for the cell population not yet locked out at programming steps just prior to locking out all of the cells targeted for each of the seven programming states (as well as the starting distribution following the first programming pulse). This indicates how well-behaved the programming progress is for the population of cells through the programming sequence. 601 represents the initial distribution. 603 corresponds to the distribution of cells after program pulse eight, just before all targeted state 1 cells are locked out. This includes both cells with states whose ultimate destination is the 1-state, but not yet locked out, as well as those just passing through on their way to higher states. This explains the number of cells with levels well above that for the 1 state. Similarly, 605 corresponds to program pulse 13, just before all state 2 cells lock out, and so on for the subsequent states.

FIG. 9 plots the number of cells still to be programmed to their corresponding verified/locked-out conditions as a function of the number of cumulative programming pulses. Superimposed are horizontal lines indicative of the number of cells which exist in the noted range of data states. Line 701 corresponds to the number of cells with data 1, 2, 3, 4, 5, 6 or 7, line 702 corresponds to the number of cells with data 2, 3, 4, 5, 6 or 7, and so on until line 707 shows the number of cells with data 7. After the first pulse, the curve is flat until the cells with data 1 begin to lock out, after which it decreases fairly linearly until it flattens out as the straggling cells in the highest state finally lock out. As expected, on the average it takes the subsequent four programming steps to complete programming the next higher state from the point where the last state had just completed programming. However, note that the crossing points of the curve to these horizontal lines, although close, do not identically match the straight line behavior, as evidenced by the kinks in the otherwise linear curve. This is a consequence of programming speed variation from the fastest and slowest programming cells, as opposed to the statistically well-behaved progression of the general population. This again points out the importance of the adaptive, smart verify approach.

As the simulation demonstrates, the smart verify approach is effective at improving device performance while also insuring a reliable program/verify/lockout operation. It does so by providing "intelligent" means to minimize the number of sequential verify operations for each program/verify/lockout step of the write sequence. By monitoring population movement to detect both the fastest programming cell, via data unconditional verification at the highest data state level covered in the verify scan range, as well as the all-cell-lockout condition for the lowest data state covered in that scan range (thereby encompassing the slowest programming cells), the $V_{th}$ scan low and high ends of the $V_{th}$ scan window can be reliably established, with minimum time wastage from extra, unneeded verify operations.

In the embodiment of FIG. 5b, the raw write performance is doubled as compared to the full seven step verify approach, with even further improvement for embodiment of FIG. 5a that includes the delay before introducing the next verify state in the programming sequence to the verify set. These improvements can be realized in memory systems whose programming rely upon an iterative process of progressively shifting the states of a set of storage elements operating in parallel followed by verifying the results of these shifts (or attempted shifts if an element is defective) by sensing, in parallel, a parameter indicative of each element's state.

An exemplary embodiment of an implementation for the smart verify technique is described with respect to FIGS. 10–13. This illustrative embodiment describes a schematic implementation of the smart verify operation on a 3-bit/storage element technology (i.e. 8-states with 7-verify sequence). For this embodiment, the storage element or memory cell is of the type for which controlled, incrementally increasing storage levels, required for controlled multi-state writing, are achieved by incrementally increasing the steering gate voltage with each successive programming pulse. In addition, multi-state memory cell reading is accomplished by sequentially scanning this steering gate through a increasing progression of 7 steering gate voltage levels (corresponding to the 7 verify voltage levels used for multi-state data programming).

FIG. 10 schematically illustrates one embodiment of the program-verify and lockout circuit for an individual memory element 1001 (lockout terminating programming of that element for the remainder of that programming session). The structure of FIG. 10 is similar to that found in the prior art for use with an embodiment such as found described in the Background section with respect to FIGS. 1 and 2 and is discussed here for reference when the smart verify case is discussed. Although the memory element 1001 in this example is a floating gate transistor, other forms of storage element can be used as is discussed below. In the case of n such memory elements being programmed in parallel (where n can typically range from hundreds to thousands), there are a corresponding n of such program-verify circuits, all working concurrently. Information emanating from these n circuits form the base for the smart verify operation.

Looking at the verify/lockout schematic of FIG. 10 in detail, the circuit includes both components that are common to all n circuits, highlighted by the double lined borders (e.g. COUNTER 1009, RESET 1021 and the reference voltage Ref), as well as components that are replicated in each circuit (e.g. COMPARATOR 1011, DATA STATE TO BE WRITTEN register 1019, and various logic elements). During program-verify, each memory element, 1001, is connected to a corresponding sense amp COMPARATOR 1011, which compares the conduction level of the cell to a reference source, Ref. In this embodiment, the action of this COMPARATOR 1011 is to output a "1" logic level whenever the output of SENSING PARAMETER DRIVER 1003 (e.g. providing the steering gate voltage magnitude B, 103, of FIG. 2), connected to the storage element's steering gate, is less than that element's stored memory state parameter (e.g. cell $V_{th}$ as exemplified by 101 in FIG. 2). (In FIG. 10, the waveforms at nodes A, B, C, and D respectively correspond to both the outputs of elements 1001, 1003, 1005, and 1007 and the waveforms labeled as 101, 103, 105, and 107, respectively, on FIG. 2.) Alternatively, whenever the output B of SENSING PARAMETER DRIVER 1003 is greater than the element's stored memory state parameter, the COMPARATOR outputs a logic "0" level.

The progression of the SENSING PARAMETER DRIVER 1003 waveform is controlled by the COUNTER 1009, which counts from 1 to 7, to generate the 7 sequential verify pulses at node B, as exemplified by waveform 103 of FIG. 2. Each cell can store one of eight possible data states {0,1,2,3,4,5,6,7}, the specific one of which, for each cell, is loaded into a corresponding DATA STATE TO BE WRITTEN register 1019. State 0 is established by a data unconditional preset operation (e.g. sector erase) to all the to-be-written cells, corresponding to phase 210 in FIG. 4. If the target data for the corresponding state is to remain 0, then the LOCKOUT for that storage element is set immediately (details of which are not shown), and no programming of that element takes place. Data states 1, 2, 3, 4, 5, 6 and 7 constitute the seven programmable states, and correspond to the COUNTER 1009 related verify levels of 1, 2, 3, 4, 5, 6 and 7, respectively, which are used during program verify to establish those states. As programming progresses, the storage element parameter (e.g. storage cell $V_{th}$) is sequentially and controllably moved through states 1, 2, 3, . . . until terminated by the verify/lockout operation.

The function of the three XNOR gates 1015a–c (corresponding to the 3-bit equivalent of the eight data states) feeding into the 4-input NAND gate 1017, all interposed between the COUNTER 1009 and the DATA STATE TO BE WRITTEN register 1019, is to trap the condition when a match occurs between the target DATA STATE TO BE WRITTEN and the instantaneous level being verified (via the SENSING PARAMETER DRIVER 1003), as governed by the COUNTER 1009 value. The fourth leg of the NAND comes from the COMPARATOR 1011 output, gated by a positive pulsing VERIFY STROBE circuit, 1005, which provides a time synchronized pulse of the comparator output D from the AND gate 1007, as exemplified by 107 in FIG. 2. Upon the combined conditions of [1] match of COUNTER (i.e. verify level) and DATA STATE TO BE WRITTEN, and [2] COMPARATOR output high (e.g. cell $Vth_{th}$ higher than verify level), the output of this 4-input NAND gate 1017 pulses down to a logical "0" (gated by the VERIFY STROBE 1005 pulse), remaining at logical "1" otherwise. The output of the 4-input NAND gate 1017 is fed into one leg (termed the set leg) of the LOCKOUT SR latch 1013 (implemented here in a cross-coupled NAND gate based latch). At the start of a data programming session to the addressed set of storage units, all LOCKOUT SR latches 1013 are set to a logical "0". This is accomplished by applying a RESET pulse 1021 (pulsing down to logic level "0" in this implementation, remaining at logic level "1" otherwise) to the other leg (termed the reset leg) of all these SR latches, initializing all corresponding storage elements' LOCKOUTs to a logical "0". Upon receipt of the negative going logical "0" pulse from the 4-input NAND gate 1017, per the conditions described above, the corresponding SR latch LOCKOUT flips to a logical "1". This condition then terminates all further programming to the associated storage element for the duration of that data programming session.

By way of example, the following describes the progression of program/verify leading to lockout for a memory cell whose data state targeted is state 3, as is shown in FIG. 2. Initially the cell is set to data state 0 (e.g. erased), and its corresponding LOCKOUT latch 1013 is set to logic level "0" by the RESET signal 1021. Then, starting with an initial programming level (e.g. steering or control gate voltage) pulse, it receives a series of progressively increasing level programming pulses, each pulse being followed by the 7-level verify pulse sequence, as illustrated in FIG. 1. For the first few programming pulses the strobed results of this verify sequence (as exemplified by 107 in FIG. 2) is all 0's (i.e. no positive going pulses). With additional programming pulses, as the cell state is pushed beyond the verify 1 level (i.e. programming into data state 1), the strobed result is a single logical "1" pulse during the level 1 verify strobe. This does not trigger the lockout condition, however, because during this time, the verify condition (i.e. COUNTER 1009 value equaling 1), does not match the targeted data state (i.e. DATA STATE TO BE WRITTEN 1019 equaling 3). When the match does occur on the verify 3 pulse, the strobed result at that point in the sequence is at "0", which inhibits setting the LOCKOUT condition.

Further program pulses push the cell state beyond the verify 2 level (i.e. programming into data state 2) resulting in a strobed result of two sequential logical "1" pulses, synchronized to the verify 1 and verify 2 strobe points. Again this does not trigger lockout, because the required matching conditions are not met. It is only after the application of further still programming pulses, which push the cell state to just beyond the verify 3 level (i.e. programming into data state 3), that the LOCKOUT condition is set to the logic level "1", terminating the application of further programming pulses to that memory cell. This occurs as follows: The strobed verify output sequence now contains three sequential logical "1" pulses, synchronized to the verify 1, verify 2 and verify 3 strobe points. During the third verify strobe, the condition of verify state (i.e. COUNTER 1009 value) and target data state are met, enabling this logical "1" pulse to be transmitted through the 4-input NAND 1017, and into the set leg of the SR LOCKOUT latch 1013.

Note that even in the event of an aberrant/excessive cell programming incident which results in state overshoot (e.g. in the above example instead of programming gradually to state 3 it suddenly overshoots and jumps to state 4), the above lockout will still take place. This is because the required COMPARATOR 1011 condition of cell $V_{th}$ exceeding verify level is still met during the verify 3 strobe, thereby triggering the lockout. Consequently, no further programming takes place, limiting the degree of write failure. If lockout were not to take place in such a situation, the cell would continue to receive programming pulses to the end of the programming session, potentially sending it to $V_{th}$ levels well beyond that allowed for the highest level state, 7, resulting in a potentially more severe degree of failure.

Not shown here is the end-of-programming-session implementation. This is implemented by embodiments which signal the earlier of [1] all addresses storage elements having achieved LOCKOUT or [2] a predetermined maximum program count having been reached. More details on the verify/lockout process can be found in U.S. Pat. No. 5,172,338 and other references incorporated above.

The goal of smart verify is to dynamically reduce the number of verifies used, at any point in the programming progression, from the full 7-set sequence to the minimum necessary for reliable write operation. FIG. 11 exemplifies such a minimum set in a peak verify level embodiment of the smart verify concept, wherein only verify pulses 3, 4, and 5 are issued. This would be this situation at, for example, program step 15 of the simulation shown in FIG. 5*b*. This dictates dynamically establishing a reliable maximum and minimum verify level required for any particular point in the programming progression (e.g. 5 and 3, respectively, in the case of FIG. 11). Waveforms 1101, 1103, 1105, and 1107 correspond to signals 101, 103, 105, and 107 of FIG. 2, and again respectively represent the signals to the cell parameter of storage element 1001 (node A), the output of sensing parameter driver 1003 (node B), the output of the verify strobe 1005 (node C), and the output of AND gate 1007 (node D of FIG. 10).

FIG. 12 schematically illustrates one preferred embodiment for implementing the maximum or peak verify level when programming n memory elements in parallel. It includes an n-input OR gate 1211, with inputs 1207 coming from the corresponding D nodes of each of the n verify/lockout circuits, as represented in FIG. 10 as the output of AND gate 1007. As described above, each D node will momentarily pulse to logic level "1" (strobed by the VERIFY STROBE, 1005 FIG. 10), whenever the storage element state (e.g. cell $V_{th}$ parameter) exceeds the applied verify level (i.e. SENSING PARAMETER, the value at node B of FIG. 10 and represented as 1103 on FIG. 11). The n-input OR gate 1211 will likewise pulse to logic level "1" whenever one or more of the addressed memory elements satisfies this programming level (e.g. cell $V_{th}$) requirement. This pulsing condition is established when the instantaneous verify level, as governed by COUNTER 1249, matches the existing value of MAX VERIFY LEVEL "COUNT" REGISTER 1233, as established by an exclusive OR circuit function implemented in the three XNORs 1251*a*–*c*, thereby allowing the pulse to pass through AND gate 1253. This pulse is then fed into the NEW MAX VERIFY LEVEL "COUNT" functional block 1235 to assert the peak verify level to its next available value.

The idea behind this implementation is that, as soon as one or more storage elements pass beyond the existing peak verify level to which they are being scanned (as stored in the MAX VERIFY LEVEL "COUNT" REGISTER" 1233), the verify sequence immediately following the next programming pulse will henceforth scan up to its next available verify level. This process is represented by the flow of the dashed line directly to the LOAD NEW MAX VERIFY COUNT circuit block 1231, which instantly loads the NEW MAX VERIFY LEVEL "COUNT" into the MAX VERIFY LEVEL "COUNT" REGISTER 1233. From that point on, under the controlled pulse programming operation, it will take a number of subsequent programming pulses before one or more of the storage elements program sufficiently to once again pass this new peak verify level. Until the latter event occurs, the n-input OR gate 1211 will maintain a logical "0", thereby freezing this current maximum verify level. When the said latter event eventually does occur (e.g. after an additional four to five programming pulses), the n-input OR gate 1211 will once again output a logical "1" pulse, thereby incrementing the maximum verify level to the next higher level.

Note that if at any time the maximum verify level attempts to exceed the top of the verify range (i.e. MAXIMUM ALLOWED in circuit block 1235), then no further such increase is allowed. The maximum verify level then remains pinned to the top of the verify range (i.e. verify level 7 in this exemplary, 3-bit embodiment).

An alternative implementation to the instantaneous incrementing approach is illustrated in FIG. 12 in the alternative branch, emanating directly below the NEW MAX VERIFY LEVEL "COUNT" circuit block 1235, and consisting of elements 1241, 1243, 1245, and 1247. Now, rather than following the dashed line when this NEW MAX VERIFY LEVEL "COUNT" circuit block 1235 is pulsed (i.e. when one or more storage elements have reached the existing peak verify level), instead, a program pulse counter, termed PROGRAM COUNT, is set to 0 via functional block 1241, and gets incremented by 1 with each successive programming pulse via functional blocks 1243 and 1245. Once this count reaches a prescribed "delay count" (e.g. delay count of 3), further such counting of programming pulses is stopped via functional blocks 1245 and 1247, and the NEW MAX VERIFY LEVEL "COUNT" is loaded into the MAX VERIFY LEVEL "COUNT" REGISTER 1233 via functional block 1231. The idea behind this alternate implementation is to delay the usage of the next higher verify level for a few programming pulses, since it will take more than said few pulses for the storage elements to reach and pass this next higher verify level, thereby saving additional time and further speeding up the write operation. The process represented in these blocks (1235, 1241, 1243, 1245, and 1247) can alternately be implemented through software or firmware, although a hardware implementation on the memory device is preferred rather than one depending on external, off-chip control.

The "delay count" value is preferably implemented through a settable parameter, as discussed previously, rather than having a fixed value. In a variation, the "delay count" value could be monitored by a controller and dynamically changed based upon device behavior, for example in response to programming or read errors, or operating conditions, such as temperature or power supply variations.

At the start of a full data program operation, the peak verify level is set to that associated with the first state (i.e. MAX VERIFY LEVEL "COUNT" REGISTER 1233 is set to 1). This is allowed because the state set for all the addressed storage elements prior to this program operation is state 0 (e.g. via an erase operation), and it will take a number of programming pulses before any of these cells reach the verify level associated with this first state.

FIG. 13 schematically illustrates one preferred embodiment for implementing the minimum verify level when programming n storage elements in parallel. It depicts n circuit blocks (1301-1 to 1301-*n*) that operate in parallel; one block for each of the n concurrently addressed storage elements. Each said circuit block includes existing circuit portions of the corresponding n verify/lockout circuits described in FIG. 10. As with FIG. 10, those circuit blocks which are common to all n circuits are highlighted by the double lined borders (.e.g. the MIN VERIFY LEVEL "COUNT" REGISTER 1305). Each said circuit block 1301-*i* (1≦i≦n) contains a matching circuit (matching DATA STATE TO BE WRITTEN 1019 with MIN VERIFY LEVEL), which consists of an exclusive-or circuit function, built from three XNOR 1331*a–c* gates feeding into a 3-input NAND gate 1333 for the exemplary 3-bit implementation.

The purpose of this matching circuit to ignore the status of all storage elements whose target data do not match that associated with the current minimum verify level. In does this by outputting a logical level "1" to the lower input leg of the 2-input OR gate 1339. This is then transmitted to the n+1 input AND gate 1313, and thereby does not interfere with the decision process.

In the case of a match (i.e. the storage element target data matches that associated with this minimum verify level), the output result of the 2-input OR gate 1339 rests with the logic level presented to its upper input leg, which is fed from LOCKOUT functional circuit block 1303. Given a match, if the associated storage element's target state has in fact been reached, as flagged by the LOCKOUT 1303 set to a logical "1", the transmitted result of the 2-input OR gate 1339 becomes a logical "1". Otherwise the transmitted result of that OR gate remains at logical "0". What this circuit does is isolate any storage elements whose target data matches the current minimum verify level and have not yet locked out, thereby transmitting a logical "0" to the n+1 input AND gate 1313. If there exists even one such storage element, this will result in a strobed logical "0" at the output of the n+1 input AND gate 1313. It is only when all such cells have locked out that a logical "1" strobed pulse is output by the n+1 input AND gate 1313. Strobing is implemented by VERIFY STROBE functional block 1005, which feeds into AND gate 1313 as well.

The output of this the n+1 input AND gate 1313 is fed into a series of two functional circuit blocks. The first circuit block 1315, termed NEW MIN VERIFY LEVEL "COUNT", will, upon receiving a logical "1" pulse, increment the existing minimum verify level by one. The following block 1317 then loads this new minimum value into the MIN VERIFY LEVEL "COUNT" REGISTER 1305, for use in subsequent program/verify series. Note that if at any time there are no storage elements targeted to the data state associated with the current minimum verify level, the embodiment of FIG. 13 will likewise increment this minimum verify level to that of the next higher data state for the following program/verify operations.

Note that if at any time the minimum verify level attempts to exceed the top of the verify range (i.e. MAXIMUM ALLOWED), then no further such increase is allowed. The minimum verify level then remains pinned to the top of the verify range (i.e. verify level 7 in this embodiment).

The underlying idea here is that, prior to all storage elements which are targeted to be written to the data state corresponding to the lowest verify level currently in use actually reaching this data state (as indicated by their corresponding LOCKOUT status), this same lowest verify level must continue to be used in the subsequent program/verify operation. Once all such cells have in fact so programmed (as testified to by all LOCKOUTs having flipped to logical "1" state), then henceforth there is no purpose to continue verifying at this same low end verify point, and the minimum verify level for the following program/verify operations can start at the next higher level.

At the start of a full data program operation, the minimum verify level is set to that associated with the first state (i.e. MIN VERIFY LEVEL "COUNT" REGISTER 1305 is set to 1), in preparation for cells to be programmed up to this verify level.

During use of the above peak verify and minimum verify embodiments in combination, the number of verify pulses following each programming pulse is dynamically kept to the minimum required at any point in the programming sequence. Typically, at the start of a program session, MAX and MIN verify levels will be both at state 1. After a number of pulses, MAX will increase to stay above the fastest programming cells. Independently, at some later point MIN will also increase, as all cells targeted for the prior minimum state have so programmed (and locked out). For this 8-state embodiment, spanning a seven step sequential verify range, this continual dynamic readjustment of max and min allows the average number of verifies required to be less than half that value (e.g. ~<3 verifies per program step on the average). As cells program up to the highest states, the maximum verify level gets pinned to the high end limit, 7, and at some later point the minimum verify level also gets pinned to this limit. Examples of such operating behavior are shown in FIGS. 5*a* and 5*b* of the disclosure.

Although the determination of the scan window is described mainly with respect to the time savings it provides when the states to be verified are checked sequentially, the present invention could also be implemented in embodiments where the multi-states are verified in parallel, such as is described in U.S. patent application Ser. No. 09/671,793 incorporated above. In the parallel case, although this may not result in the same advantage in terms of increased speed, it may have other advantages, such as a decrease in power consumption.

Although the discussion so far has referred mainly to multi-state embodiments using a charge storing device, such as floating gate EEPROM or FLASH cells, for the memory device, it can be applied to other multi-state embodiments as well, including magnetic and optical media, as well as volatile storage media such as multi-state DRAM. As the particulars of how the storage elements are read, are written to, and store data do not enter into the main aspects of the present invention, the various aspects of the present invention may be applied to other memory types, including, but not limited to, sub 0.1 um transistors, single electron transistors, organic/carbon based nano-transistors, and molecular transistors. For example, NROM and MNOS cells, such as those respectively described in U.S. Pat. No. 5,768,192 of Eitan and U.S. Pat. No. 4,630,086 of Sato et al., or magnetic RAM and FRAM cells, such as those respectively described in U.S. Pat. No. 5,991,193 of Gallagher et al. and U.S. Pat. No. 5,892,706 of Shimizu et al., all of which are hereby incorporated herein by this reference, could also be used.

Although the invention has been described with respect to various exemplary embodiments, it will be understood that the invention is entitled to protection within the full scope of the appended claims.

It is claimed:

1. A method of operating a non-volatile memory having a plurality of multi-state storage elements, comprising:
    applying a first programming pulse to selected ones of said storage elements;
    verifying the result of said first programming pulse on said selected storage elements for a first subset of said multi-state levels;
    forming a second subset of said multi-state levels based on the results of said verifying, comprising determining whether to include in said second subset one of said multi-state levels not included in the first subset;
    subsequent to said verifying, applying a second programming pulse to one or more of said selected storage elements; and
    verifying the result of said second programming pulse on said one or more of said selected storage elements for the second subset of said multi-state levels.

2. The method of claim 1, wherein the application of further programming pulse is terminated to those of said selected storage elements that verify at a respective target value in said verifying the result of said first programming pulse.

3. The method of claim 1, wherein said forming a second subset of said multi-state levels based on said verifying further comprises determining whether to exclude in said second subset one of said multi-state levels included in the first subset.

4. A method of performing a programming operation on a plurality of multi-state data storage elements, comprising:
    performing a programming operation to incrementally move the storage elements from a first data state sequentially through a plurality of second data states;
    verifying the result of the preceding programming operation for a subset of one or more target values from a set of target values each corresponding to a respective second data state;
    subsequently re-establishing said subset of one or more of said target values for a subsequent verify operation based on the result of the preceding verifying, comprising determining whether to include a target value not in the subset of the preceding verifying; and
    subsequently repeating the performing a programming operation and the verifying using said re-established subset of target values.

5. The method of claim 4, further comprising:
    terminating further programming of those of said plurality of storage elements that verify at their respective target value in said verifying the result of the preceding programming operation.

6. The method of claim 4, wherein said verifying the result comprises sequentially comparing the result of the preceding programming operation against the subset of target values.

7. The method of claim 4, wherein said subsequently re-established subset of target values is the same as the preceding subset of target values.

8. The method of claim 4, wherein subsequently re-establishing said subset of target values further comprises determining whether to delete a target value in the subset of the preceding verifying.

9. The method of claim 4, wherein said performing a programming operation comprising pulsing the storage elements with a programming voltage.

10. The method of claim 9, wherein said storage elements are EEPROM memory cells and said verifying comprises comparing a parameter indicative of the threshold values of the memory cells against the subset of target values, wherein said target values are values of said parameter.

11. The method of claim 4, further comprising, subsequent to the repeating the performing a programming operation and the verifying using the re-established subset, repeating one or more times:
   subsequently re-establishing said subset of one or more target values for a subsequent verify operation based on the result of the preceding verifying, comprising determining whether to include a target value not in the subset of the preceding verifying; and
   subsequently repeating the performing a programming operation.

12. The method of claim 11, further comprising:
   removing from the plurality of multi-state data storage elements those of said storage elements that fail to program properly.

13. The method of claim 11, wherein said determining whether to include a target value N not in the subset of target values of the preceding verifying is based on one or more of said storage elements verifying at one of said subset of target values in said preceding verifying.

14. The method of claim 13, wherein the target value N in the sequence of the second data states is included in the subset of target values in response to one or more of said storage elements verifying at the target value (N−1) in the sequence of the second data states.

15. The method of claim 14, wherein a target value N is included in the verify subset a first number of programming operations after one or more of said storage elements verifying at the target value (N−1) in the preceding verifying.

16. The method of claim 15, wherein said first number is a settable parameter.

17. A memory comprising:
   a plurality of multi-state storage elements;
   programming circuitry connectable to the storage units to perform a program operation whereby the state of storage elements can be changed;
   sensing circuitry connectable to the storage elements to determine the value of a parameter indicative of the state of the storage elements;
   comparison circuitry connected to the sensing circuitry for performing a program verify operation using target values for said parameter corresponding to a subset of the multi-state levels; and
   logic circuitry connected to the comparison circuitry, wherein adding of one or more multi-state levels to the subset of the multi-state levels that are used in the program verify operation is determined based on the results of the preceding program verify operation.

18. The memory of claim 17, wherein in a program verify operation the comparison circuitry compares state of said storage elements to the target values sequentially.

19. The logic circuitry of claim 17, wherein deletion of one or more multi-state levels from the set of the multi-state levels that are used in the program verify operation is determined based on the results of the preceding program verify operation.

20. The memory of claim 17, wherein the logic circuitry locks out from further programming storage elements that correctly verify to their respective target values in the program verify operation.

21. The memory of claim 17, wherein the storage elements are floating gate memory cells.

* * * * *